US006558852B1

(12) United States Patent
Tawarayama et al.

(10) Patent No.: US 6,558,852 B1
(45) Date of Patent: May 6, 2003

(54) EXPOSURE METHOD, RETICLE, AND METHOD OF MANUFACTURING SEMICONDUCTOR DEVICE

(75) Inventors: Kazuo Tawarayama, Tokyo; Takuya Kouno, Mie-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 217 days.

(21) Appl. No.: 09/604,723

(22) Filed: Jun. 28, 2000

(30) Foreign Application Priority Data

Jun. 30, 1999 (JP) .......................... 11-186713

(51) Int. Cl.⁷ .............................................. G03F 9/00
(52) U.S. Cl. ............................................ 430/5; 430/22
(58) Field of Search ............................ 430/5, 22, 394; 356/400, 401; 355/53

(56) References Cited

U.S. PATENT DOCUMENTS

| 5,473,435 A | 12/1995 | Masuyuki et al. | 356/372 |
| 5,733,690 A * | 3/1998 | Jeong et al. | 430/5 |
| 5,856,054 A | 1/1999 | Tomimatu | 430/22 |
| 6,128,070 A * | 10/2000 | Peng | 430/30 |

FOREIGN PATENT DOCUMENTS

| JP | 10-125578 | 5/1998 |
| JP | 11067641 | 3/1999 |
| JP | 11-195596 | 7/1999 |

* cited by examiner

Primary Examiner—S. Rosasco
(74) Attorney, Agent, or Firm—Finnegan, Henderson, Farabow, Garrett & Dunner, L.L.P.

(57) ABSTRACT

An exposure method forms, in a shot area on a reticle, marks to measure arrangement errors that may occur between adjacent device patterns, transfers the marks from the reticle onto a wafer through exposure and development processes using an exposure system, measures arrangement errors according to the marks on the wafer, calculates four error components from the measured arrangement errors, and corrects the exposure system according to the calculated error components. This method eliminates superposition errors from the next exposure process, thereby effectively using the shot areas of exposure systems.

20 Claims, 14 Drawing Sheets

FIG. 7
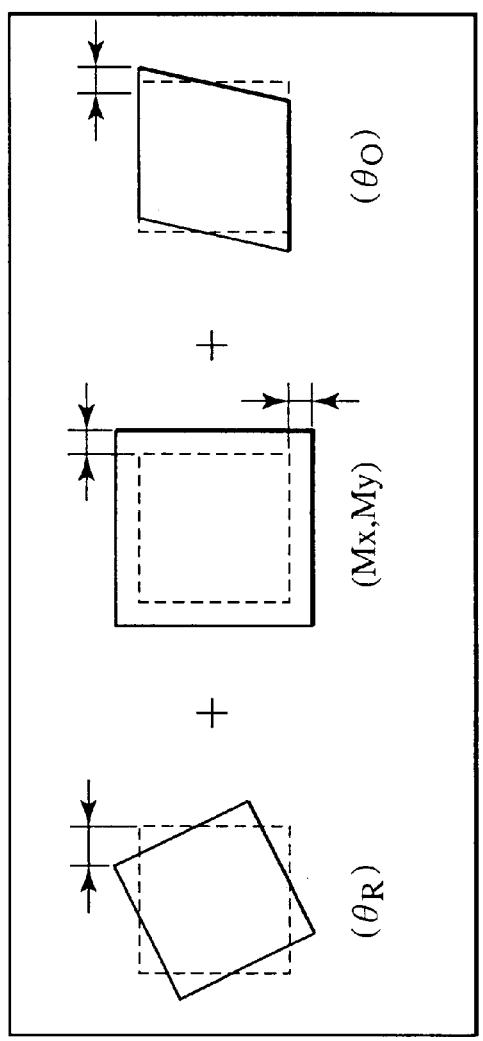
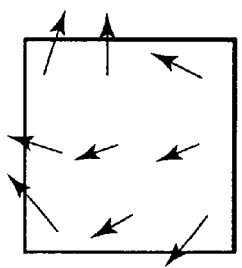

EXPOSURE METHOD, RETICLE, AND METHOD OF MANUFACTURING SEMICONDUCTOR DEVICE

CROSS REFERENCE TO RELATED APPLICATIONS

The subject application is related to subject matter disclosed in the Japanese Patent Application No. Hei 11-186713 filed Jun. 30, 1999 in Japan to which the subject application claims priority under the Paris Convention and which is incorporated herein by reference.

BACKGROUND OF THE INVENTION

1. Field of the Invention

The present invention relates to an exposure process in manufacturing semiconductor devices and the display elements of, for example, liquid-crystal display panels, and particularly, to an exposure method, a reticle, and a method of manufacturing semiconductor devices, capable of reducing arrangement errors.

2. Description of the Related Art

Manufacturing semiconductor devices and the display elements of, for example, liquid-crystal display panels involves an exposure process. The exposure process employs a reticle, or a mask having device patterns and repeatedly projects the patterns on a wafer through step-and-repeat operations with the use of an exposure system. A layout of the patterns on a wafer is designed to maximize the number of devices or chips to be produced from the wafer. According to the layout, a layout of shots on the wafer is determined. A shot is a unit of exposure carried out by an exposure system with respect to a wafer, and a shot area on the wafer is determined by a shot area on a reticle of the exposure system. To improve productivity, the shot area must cover a plurality of device or chip patterns so that a plurality of devices are simultaneously exposed on a wafer.

The number of device patterns contained in a shot area is determined by the size of each device pattern and the maximum angle of view of an exposure system. An exposure system having a large shot area is capable of simultaneously exposing a larger number of device patterns, to improve productivity.

Prior arts usually employ the same shot layout from the first to last exposure layers when forming device patterns on a wafer. Recent price and system situations, however, impose a requirement of employing exposure systems of different shot areas in combination to expose a wafer when manufacturing semiconductor devices. To meet the requirement, a prior art equalizes the shot areas of exposure systems by restricting the using area of reticle of each exposure system. Namely, the prior art reduces the large shot area of a high-performance exposure system to the small shot area of a low-performance exposure system. As a result, the prior art prevents, the high-performance exposure system from fully operating, unnecessarily increases the number of shots with the restricted shot area, and deteriorates throughputs.

SUMMARY OF THE INVENTION

The present invention enables exposure systems of different shot areas to operate as they are when manufacturing semiconductor devices.

FIG. 1A shows a shot area 11 of an exposure system 21 and FIG. 1B shows a shot area 12 of an exposure system 22. The shot area 11 of FIG. 1A has a size of 25 mm by 33 mm and covers three device patterns 6 each of 22 mm by 11 mm. The device patterns 6 are formed on a reticle. The shot area 12 of FIG. 1B has a size of 22 mm by 22 mm and covers two device patterns 8 each of the same size as the device pattern 6. The device patterns 8 are formed on a reticle. When manufacturing semiconductor devices, a first exposure process employs the exposure system 21 to form the device patterns 6 on a wafer, and a second exposure process employs the exposure system 22 to form the device patterns 8 on the wafer.

FIG. 2 shows the device patterns 6 and 8 formed on a wafer with the use of the shot areas 11 and 12 of the exposure systems 21 and 22 as they are. Positional relationships among the device patterns of FIG. 2 are exaggerated. The first exposure process forms pattern groups 13 and 14 each consisting of three device patterns 6. A bottom side of the pattern group 13 disagrees with a top side of the pattern group 14. This disagreement is an arrangement error.

The second exposure process superposes the device patterns 8 on the device patterns 6 on the wafer. Two device patterns 8 of a pattern group 15 are formed on the upper two device patterns 6 of the pattern group 13. To align the pattern groups 13 and 15 with each other, the first exposure process forms first alignment marks. The second exposure process employs second alignment marks, detects the first alignment marks, and adjusts the second alignment marks to the detected first alignment marks. This alignment work may correctly be carried out by employing an enhanced global alignment (EGA) technique that reads the positions of the first alignment marks, calculates arrangement errors according to the read marks, and corrects the second exposure process according to the calculated arrangement errors. Two device patterns 8 of a pattern group 16 are formed on the lowermost device pattern 6 of the pattern group 13 and the uppermost device pattern 6 of the pattern group 14. Two device patterns 8 of a pattern group 17 are formed on the lower two device patterns 6 of the pattern group 14. If the upper device pattern 8 of the pattern group 16 is aligned with the lowermost device pattern 6 of the pattern group 13, the lower device pattern 8 of the pattern group 16 does not align with the uppermost device pattern 6 of the pattern group 14. This is a superposition error. If the first exposure process causes an arrangement error in the device patterns 6, the second exposure process causes a superposition error. A process that allows a large superposition error, such as a process of forming openings on a polyimide film may accept two exposure systems of different shot areas to be used as they are. However, a process that scarcely allows superposition errors never accepts two exposure systems of different shot areas to be used as they are.

To reduce superposition errors between first and second exposure processes, no prior art has tried to reduce arrangement errors.

An object of the present invention is to provide an exposure method capable of reducing arrangement errors so that exposure systems may effectively use their shot areas even for a process that scarcely allows superposition errors.

Another object of the present invention is to provide a reticle applicable to the exposure method capable of reducing arrangement errors so that exposure systems may effectively use their shot areas even for a process that scarcely allows superposition errors.

Still another object of the present invention is to provide a method of manufacturing semiconductor devices, capable of reducing arrangement errors so that exposure systems may effectively use their shot areas even for a process that scarcely allows superposition errors.

In order to accomplish the objects, a first aspect of the present invention provides an exposure method including the steps of forming, in a shot area on a reticle, marks to measure arrangement errors that may occur between adjacent device patterns, transferring the marks from the reticle onto a wafer through exposure and development processes using an exposure system, measuring arrangement errors according to the marks on the wafer, calculating four error components from the measured arrangement errors, and correcting the exposure system according to the calculated error components. The first aspect reduces arrangement errors.

The first aspect may form at least one mark on each side of the shot area of the reticle, to secure the error correcting effect. The first aspect can measure arrangement errors between adjacent pattern groups along each side of the pattern groups, the pattern groups being formed on the wafer and each corresponding to the shot area of the reticle. This improves the correct positioning of pattern groups over the entire surface of the wafer.

According to the first aspect, the marks may be box-in-box marks or bars-in-bars marks serving as outer and inner marks. The box-in-box marks consist of large and small squares so that the small square may fit in the large square, a positional relationship between the large and small squares being used to correctly position device patterns on a wafer. The bars-in-bars marks consist of a plurality of bars instead of the squares. In the box-in-box marks, the large square is an outer mark and the small square is an inner mark. These marks are used to measure positional and arrangement errors related to device patterns formed on a wafer.

A second aspect of the present invention provides a reticle. The reticle has a shot area of rectangular or square shape, at least one device pattern formed in the shot area, a first mark having a first aligning point and formed inside the shot area and outside the device pattern in the vicinity of a first side of the shot area, and a second mark having a second aligning point and formed inside the shot area and outside the device pattern in the vicinity of a second side of the shot area opposite to the first side. A first straight line that connects the first and second aligning points is perpendicular to the first side. The first and second marks are distinguishable from each other. If the marks are box-in-box marks, the aligning point of each box mark is the center thereof. If there is no arrangement error, the aligning points of corresponding box marks agree with each other. To make the first and second marks distinguishable from each other even if they are superposed one upon another, the first and second marks have different shapes or sizes. The reticle of the second aspect is applicable to the exposure method that is capable of reducing arrangement errors.

A third aspect of the present invention provides a method of manufacturing semiconductor devices, including the steps of carrying out an exposure process on a wafer according to the exposure method of the first aspect, and carrying out an exposure process on the wafer to superpose patterns on the patterns that have been formed by the first exposure process. The third aspect manufactures semiconductor devices having minimized arrangement errors.

The third aspect is effective when the size of a shot area for the first exposure process differs from the size of a shot area for the second exposure process. The third aspect is capable of manufacturing semiconductor devices by using exposure systems of different shot areas without restricting the shot areas.

The first exposure process of the third aspect may be an exposure process carried out on the wafer for the first time. In this case, the third aspect reduces superposition errors caused by arrangement errors through all exposure processes.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 7 shows models of arrangement error components;

DESCRIPTION OF THE PREFERRED EMBODIMENTS

Figure 1A:
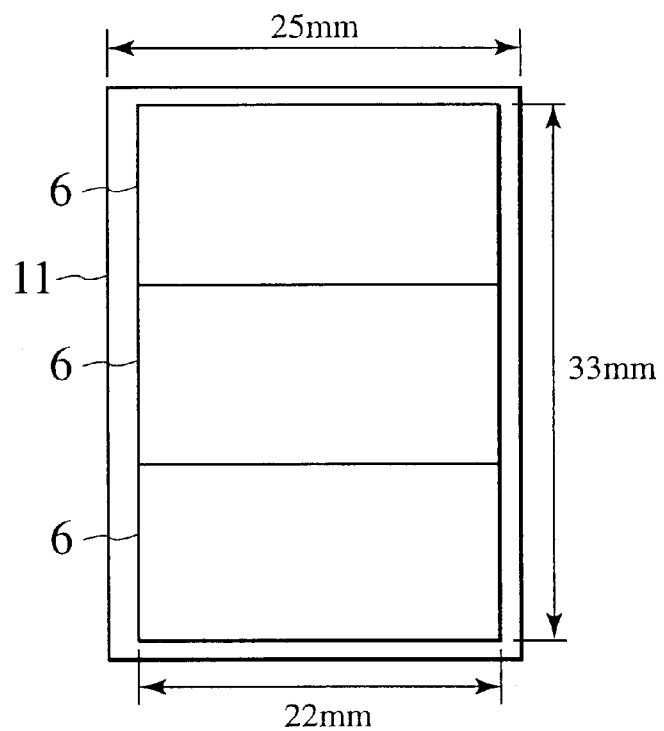
FIGS. 1A and 1B show the shot areas of two exposure systems 21 and 22 containing different numbers of device patterns.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 3:
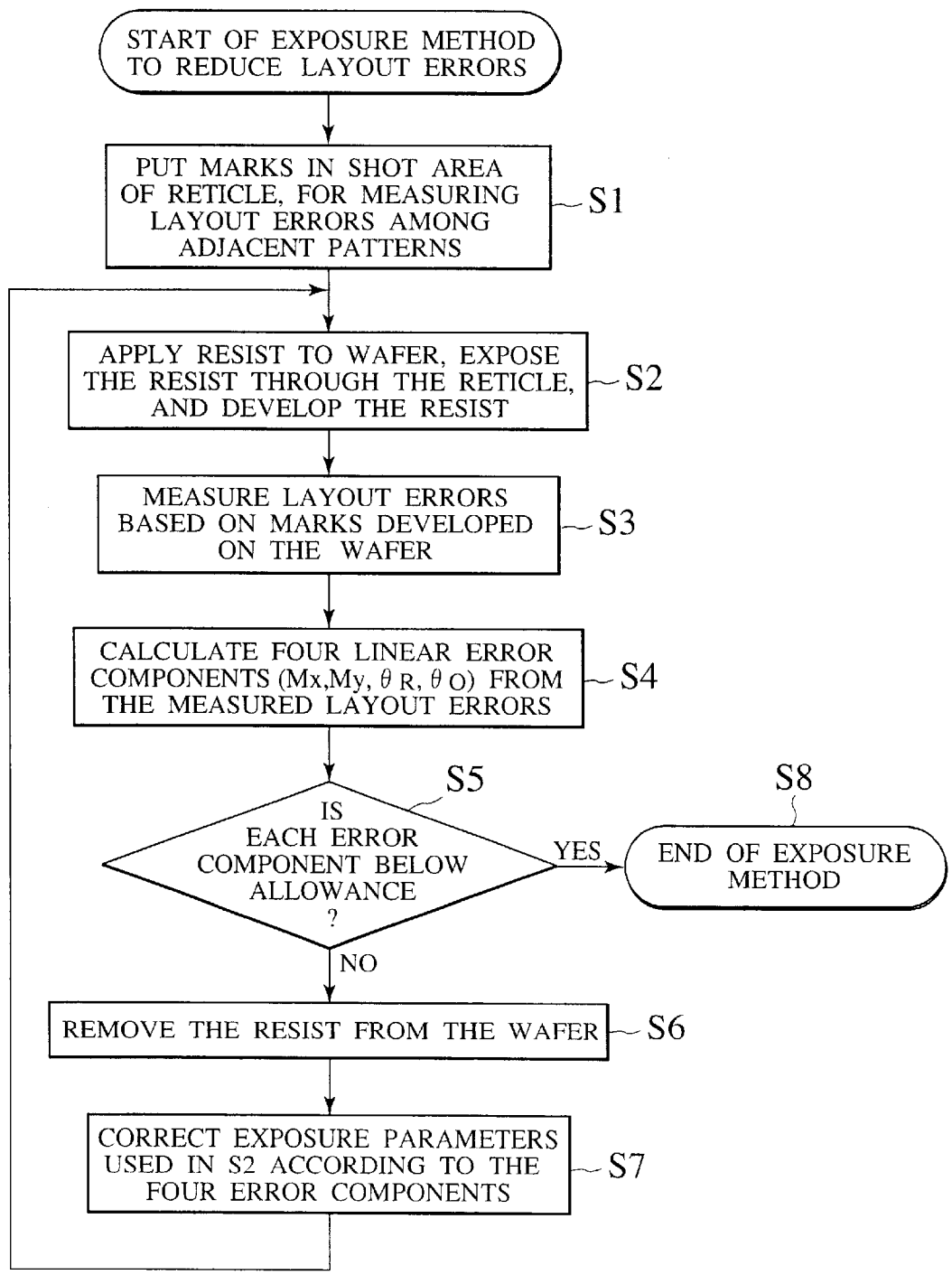
FIG. 3 is a flowchart showing an exposure method according to a first embodiment of the present invention capable of reducing arrangement errors.

FIG. 3 is a flowchart showing an exposure. method according to the first embodiment of the present invention capable of reducing arrangement errors.

(a) Step S1 forms marks in a shot area on a reticle. The marks are used to measure arrangement errors between adjacent device patterns to be formed on a wafer. The marks include at least a pair of interlock marks each formed in the vicinity of a side of the shot area of the reticle along a scribe line. The marks may be box-in-box marks or bars-in-bars marks used to detect arrangement errors between adjacent sides of device patterns, the device patterns being formed on a wafer by step-and-repeat operations that use the reticle.

(b) Step S2 coats a wafer with resist, operates an exposure system to expose the wafer through the reticle having the marks, and develops the wafer.

(c) Step S3 measures arrangement errors based. on the marks developed on the wafer. When arrangement errors are zeroed, device patterns formed on the wafer through the reticle are correctly aligned with a square or rectangle lattice. Namely, by measuring arrangement errors based on the marks, it is possible to calculate arrangement errors related to device patterns formed on the wafer.

(d) Step S4 calculates, according to the measured arrangement errors, four error components, i.e., an x-magnification error component Mx, a y-magnification error component My, a rotational error component OR, and an orthogonality error component θO.

(e) Step S5 determines whether or not each error component is within an allowance.

(f) If each error component is within the allowance, step S8 completes the exposure method.

(g) If any one of the error components is outside the allowance, step S6 removes the resist from the wafer.

(h) Step S7 corrects parameters related to the exposure system used in step S2 according to the calculated error components, and returns to step S2. This loop is repeated until step S5 confirms that every error component is within the allowance.

Figure 4:
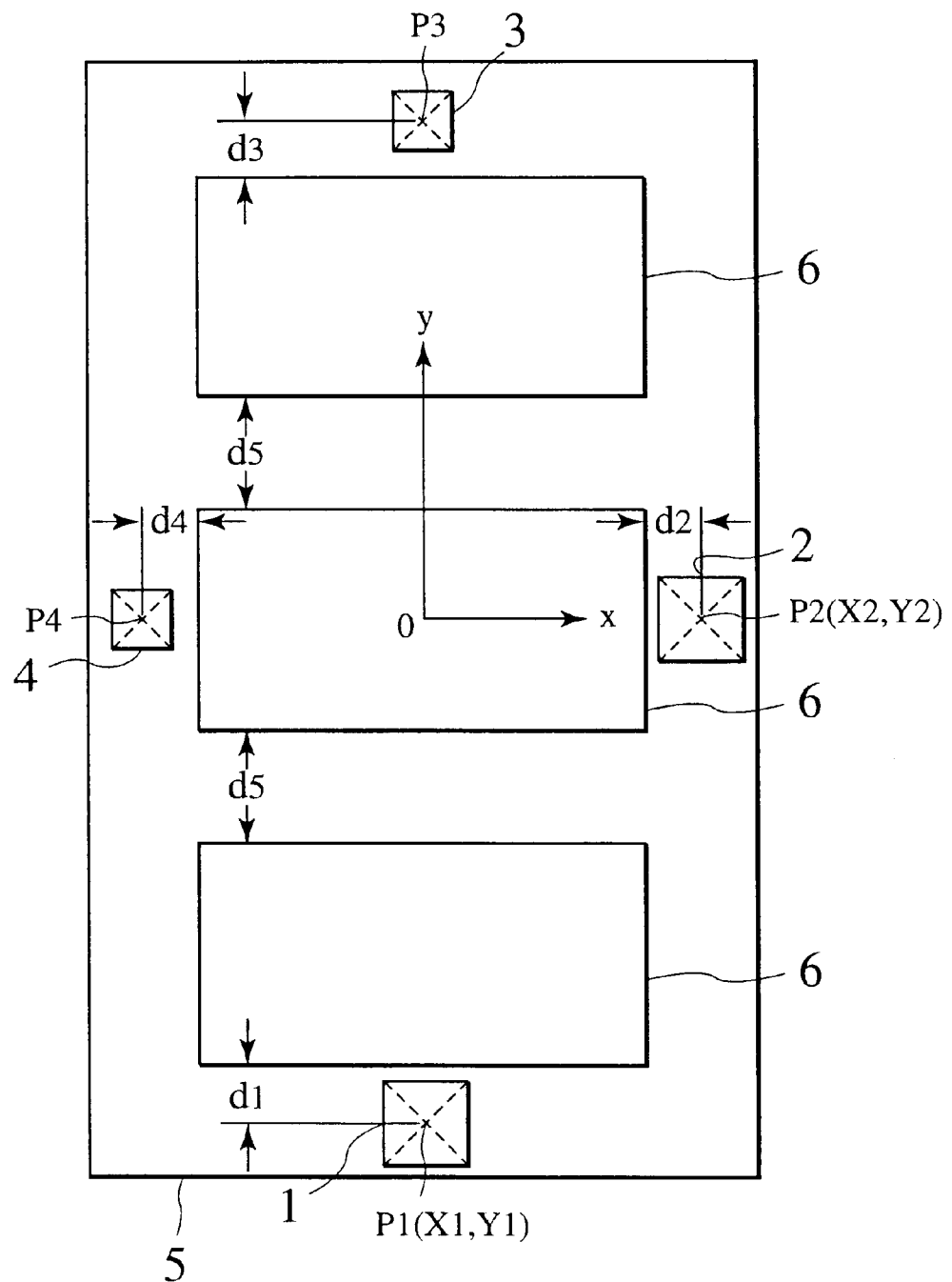
FIG. 4 is a plan view showing a shot area on a reticle according to the first embodiment.

FIG. 4 is a plan view showing a shot area on a reticle according to the first embodiment. Marks on the reticle are formed in step S1 of FIG. 3. These marks are used to measure arrangement errors. The shot area 5 on the reticle has a rectangular or square shape. Device patterns 6 are formed inside the shot area 5. The marks on the reticle include two pairs of outer and inner marks that are inside the shot area 5 and outside the device patterns 6. One of the mark pairs is composed of an outer mark 1 and an inner mark 3, and the other an outer mark 2 and an inner mark 4.

The outer mark 1 has a center P1 and the inner mark 3 has a center P3. A straight line that connects the centers P1 and P3 is in parallel with sides of the shot area 5. The outer mark 2 has a center P2 and the inner mark 4 has a center P4. A straight line that connects the centers P2 and P4 is in parallel with sides of the shot area 5.

If there are a plurality of device patterns 6 in the direction of the outer and inner marks 1 and 3, the device patterns 6 are equally separated from one another by a distance d5. The distance d5 is equal to the sum of a distance d1 between the center P1 of the outer mark 1 and the proximal device pattern 6 and a distance d3 between the center P3 of the inner mark 3 and the proximal device pattern 6. In FIG. 4, three device patterns 6 are arranged in a vertical row between the outer and inner marks 1 and 3 at the regular intervals of d5. The distance d5 is equal to the distance d1 between the center P1 and the proximal device pattern 6 plus the distance d3 between the center P3 and the proximal device pattern 6. As a result, device patterns transferred from the reticle onto a wafer are equally distanced from one another by a distance corresponding to the distance d5.

Between the pair of outer and inner marks 2 and 4, there is a line of the device patterns 6. The sum of a distance d2 between the center P2 of the outer mark 2 and the proximal device pattern 6 and a distance d4 between the center P4 of the inner mark 4 and the proximal device pattern 6 determines a horizontal or lateral distance between device patterns on a wafer.

An x-y coordinate system is set as shown in FIG. 4. A point 0 of the x-y coordinate system is set at the center of the shot area 5, and x- and y-axes extend in parallel with the sides of the shot area 5. The center P1 of the outer mark 1 has coordinates (X1, Y1), and the center P2 of the outer mark 2 has coordinates (X2, Y2). These coordinates are used to calculate error components in step S4 of FIG. 3.

Figure 5:
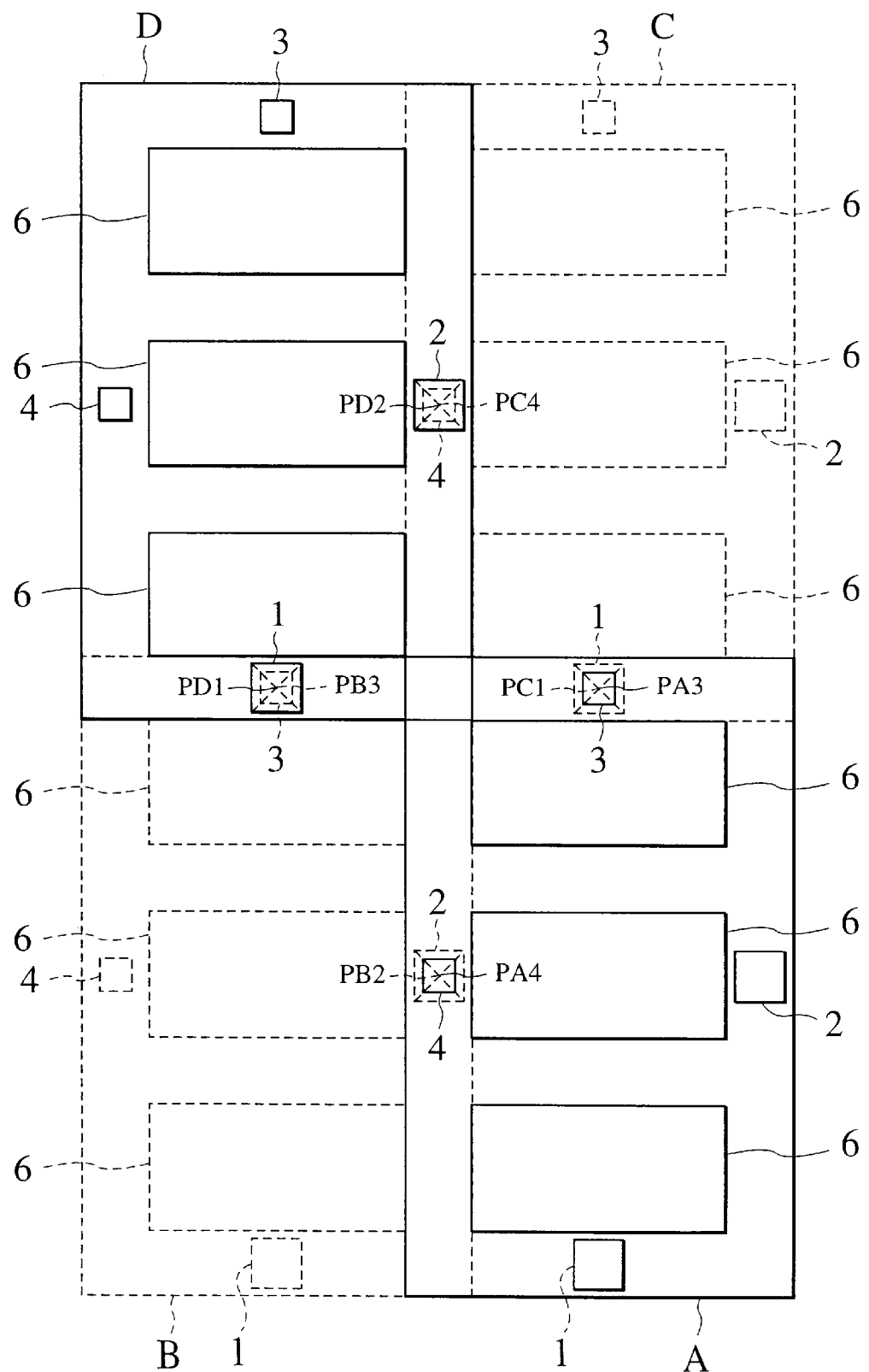
FIG. 5 shows device patterns formed on a wafer according to step-and-repeat operations with the reticle of FIG. 4.

FIG. 5 shows positions on a wafer where the shot area 5 is positioned by step-and-repeat operations in step S2 of FIG. 3. Four shot areas A, B, C, and D on the wafer correspond each to the shot area 5 of FIG. 4. The wafer is coated with resist, and the reticle having the shot area 5 of FIG. 4 is used to expose the shot area A of the wafer. Then, the shot area 5 of the reticle sequentially exposes the shot areas B, C, and D of the wafer. By repeating these steps, the whole surface of the wafer is exposed with the shot area 5.

The movement of the reticle to sequentially expose the shot areas A to D, etc., on the wafer is controlled by the exposure system according to a distance between adjacent shot areas on the wafer. For example, according to a distance to a left shot area, the position of the shot area B relative to the shot area A is determined. Similarly, the position of the shot area D relative to the shot area C is determined. According to a distance from a lower shot area to an upper shot area, the position of the shot area C relative to the shot area A is determined, and the position of the shot area D relative to the shot area B is determined.

These distances are control values for the exposure system and are absolute values that are theoretically determined according to the device patterns 6 formed on the reticle and device patterns projected from the reticle onto a wafer. A layout of device patterns on a wafer is called a chip layout. Exposure systems suffer from aging and reticles and wafers involve warps. These factors make shot areas and device patterns on a wafer deviate from theoretical positions. Such deviations are arrangement errors. To reduce the arrangement errors, it is necessary to correct control values for each exposure system. The arrangement errors are measurable according to the outer marks 1 and 2 and inner marks 3 and 4 of FIG. 4. In FIG. 5, the center PA4 of the inner mark 4 of the shot area A is designed to agree with the center PB2 of the outer mark 2 of the shot area B. Accordingly, the distance between the centers PA4 and PB2 is an arrangement error of the shot area B relative to the shot area A. The center PA3 of the inner mark 3 of the shot area A is designed to agree with the center PC1 of the outer mark 1 of the shot area C. Accordingly, the distance between the centers PA3 and PC1 is an arrangement error of the shot area C relative to the shot area A. The center PB3 of the inner mark 3 of the shot area B is designed to agree with the center PD1 of the outer mark 1 of the shot area D. Accordingly, the distance between the centers PB3 and PD1 is an arrangement error of the shot area D relative to the shot area B. The center PC4 of the inner mark 4 of the shot area C is designed to agree with the center PD2 of the outer mark 2 of the shot area D. Accordingly, the distance between the centers PC4 and PD2 is an arrangement error of the shot area D relative to the shot area C. These center-to-center distances are measured to determine arrangement errors.

The shot area D may involve two arrangement errors, one with respect to the shot area B and the other with respect to the shot area C. The shot area D, therefore, is usable to measure not only translation distances but also rotation, magnification, and orthogonality errors. In the following, the shot area D will be studied to find an arrangement error relative to the shot area B, an arrangement error relative to the shot area C, and errors in rotation, magnification, and orthogonality.

Figure 6:
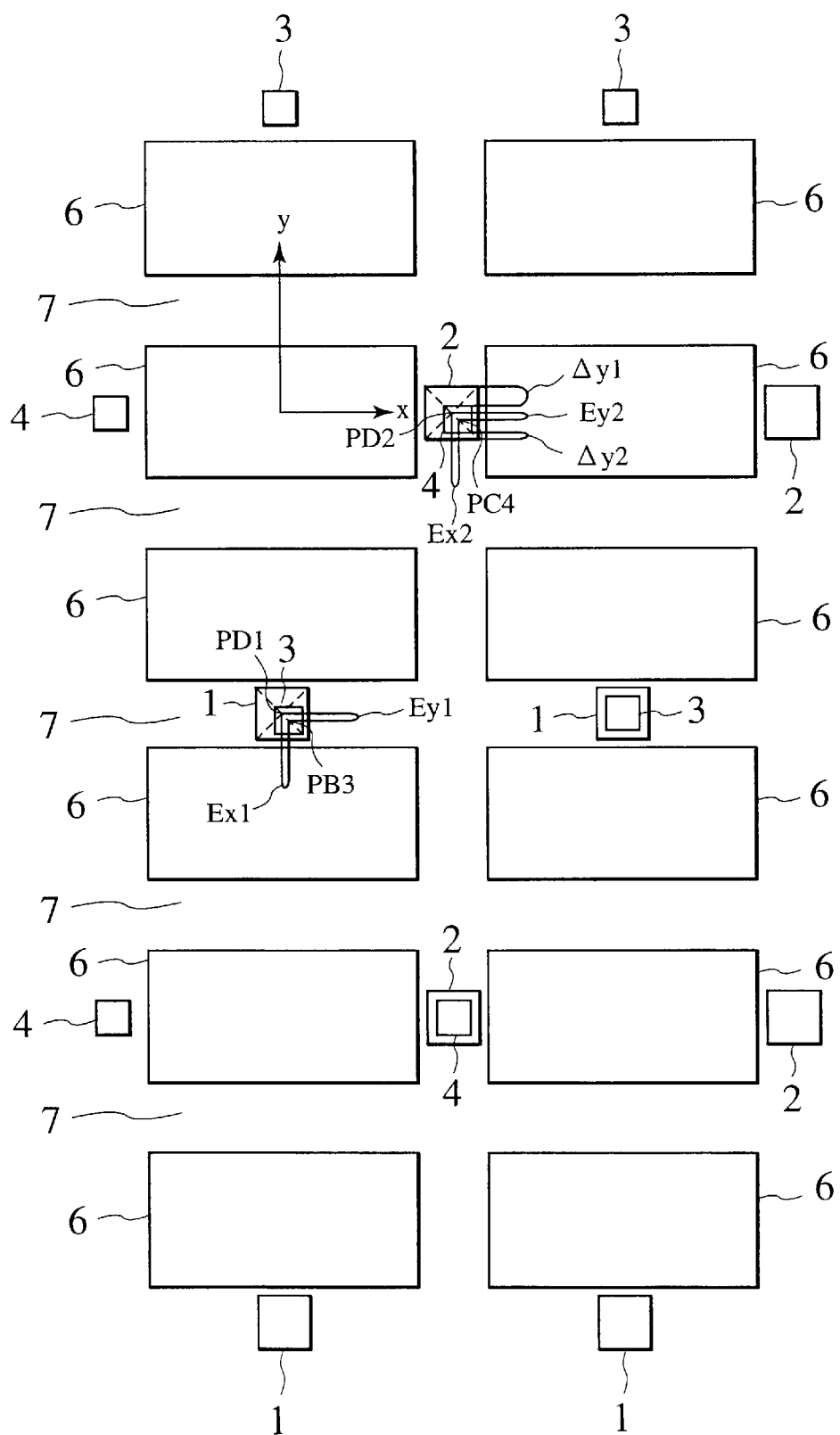
FIG. 6 shows a technique of measuring arrangement errors according to outer and inner marks developed on a wafer according to the first embodiment.

FIG. 6 shows the technique of measuring arrangement errors from the outer and inner marks on the wafer. This figure corresponds to the development step S2 and error measuring step S3 of FIG. 3. Namely, the arrangement of FIG. 6 is developed from the arrangement of FIG. 5 and includes the device patterns 6, outer marks 1 and 2, and inner marks 3 and 4 on the wafer.

The centers PD1 and PB3 have an arrangement error to disagree with each other. Like FIG. 4, an x-y coordinate system is set. The center PD1 has an x-difference Ex1 with respect to the center PB3. This is an x-component of arrangement errors at the center PD1. Also, the center PD1 has a y-difference Ey1 with respect to the center PB3. This is a y-component of the arrangement errors at the center PD1. These differences Ex1 and Ey1 are measured. Similarly, an x-difference Ex2 (x-component of arrangement errors) and a y-difference Ey2 (y-component of the arrangement errors) of the center PD2 with respect to the center PC4 are measured. In practice, the differences Ex1 and Ey1 are measurable with a mismatch measuring apparatus such as an optical mismatch inspecting apparatus.

FIG. 7 shows models of arrangement error components including a rotational error component θR, an x-magnification error component Mx, a y-magnification error component My, and an orthogonality error component θO. The reason why translation error components are omitted is because they are caused by a wafer stepping mechanism of each exposure system and does not serve as factors to cause other error components. Namely, the translation error components must separately be considered. The rotational error component θR is a rotational error around the center of a shot area and rotates an image on a wafer with respect to a reticle. A correction to be made on the exposure system against the rotational error component θR is to make the arranging direction of shot areas (the stepping direction of a wafer) run in parallel with the sides of the shot areas. The x-magnitude error component Mx projects an x-distance between optional two points on a reticle onto a wafer at a certain magnification ratio. The y-magnification error component My projects a y-distance between optional two points on a reticle onto a wafer at a certain magnification ratio. The orthogonality error component θO incorrectly projects a right angle on a reticle onto a wafer. Corrections on the exposure system against these error components Mx, My, and θO are made by adjusting an optical mechanism of the exposure system for transferring an image of a reticle onto a wafer.

The error components Mx, My, θR, and θO are calculated as follows:

$$Mx = (Ex2 - Ey2 \times |Y2/X2|)/2/X2 \quad (1)$$

$$My = (Ey1 - Ex1 \times |X1/Y1|)/2/Y1 \quad (2)$$

$$\theta R = Ey2/2/X2 \quad (3)$$

$$\theta O = -Ex1/2/Y1 - Ey2/2/X2 \quad (4)$$

where X1 is an x-coordinate of the center P1 of the outer mark 1 of FIG. 4, Y1 is a y-coordinate of the center P1, X2 is an x-coordinate of the center P2 of the outer mark 2, Y2 is a y-coordinate of the center P2, Ex1 is an x-component of arrangement errors at the center PD1 of FIG. 6, Ey1 is a y-component of the arrangement errors at the center PD1, Ex2 is an x-component of arrangement errors at the center PD2, and Ey2 is a y-component of the arrangement errors at the center PD2.

It is determined whether or not each of the error components calculated in step S5 of FIG. 3 is within an allowance. Each allowance is determined according to the performance of the exposure system, such as reproducibility and correction accuracy, and the specifications of a semiconductor device produced with the exposure system. If at least one of the error components exceeds the allowance, step S6 removes the resist from the wafer, and step S7 corrects the exposure system according to the error components calculated in step S4. Thereafter, step S2 is again carried out. The loop to step S2 is repeated until step 5S determines that every error component is within the tolerance.

Figure 8:
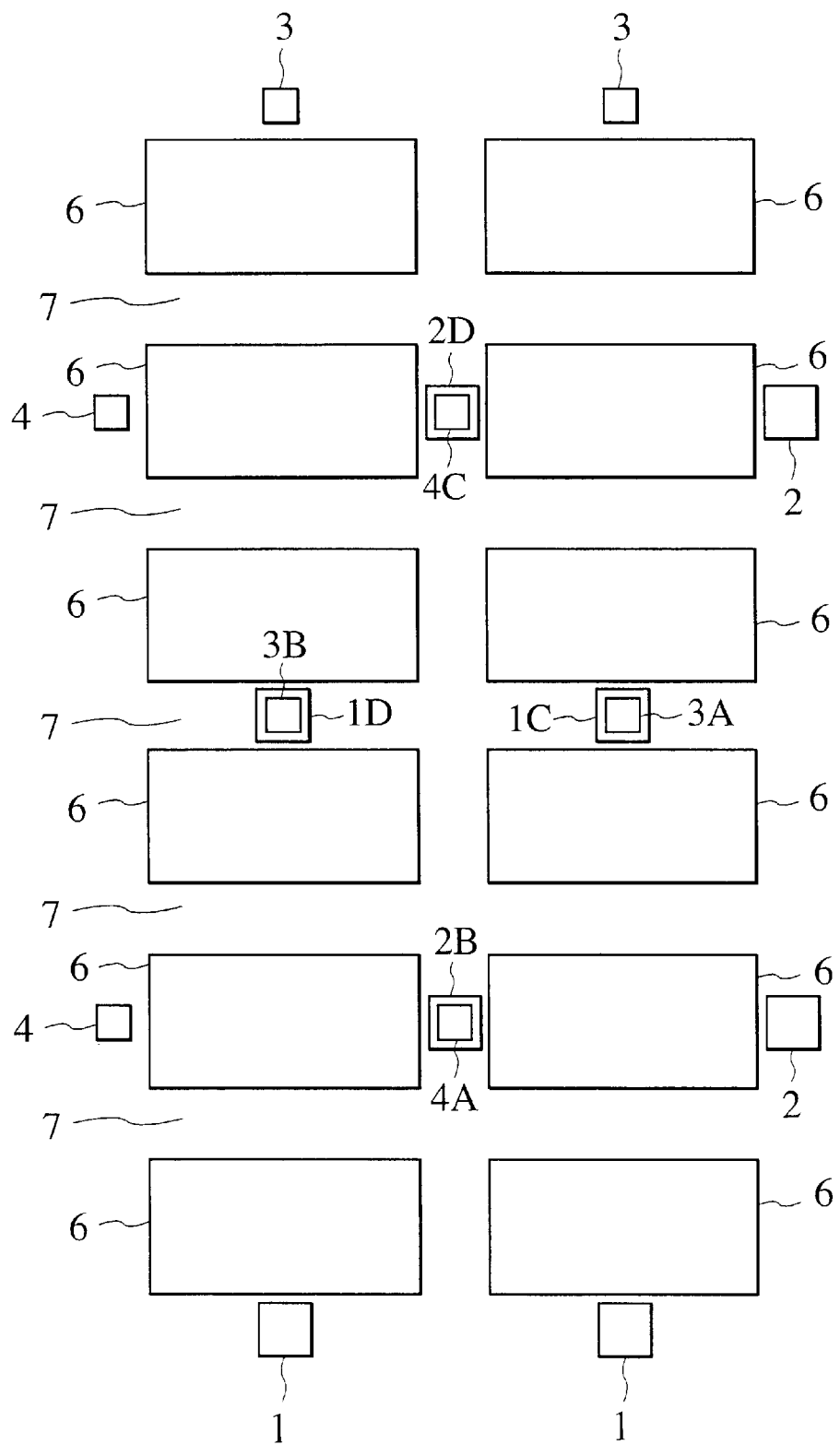
FIG. 8 shows outer and inner marks developed on a wafer with every error component being within an allowance according to the first embodiment.

FIG. 8 shows outer and inner marks developed on a wafer with every error component being within a tolerance. This state is obtained after the completion of step S8 of FIG. 3. The center of the inner mark 4A of the shot area A is aligned with the center of the outer mark 2B of the shot area B on the wafer. The center of the inner mark 3A of the shot area A is aligned with the center of the outer mark 1C of the shot area C. The center of the inner mark 3B of the shot area B is aligned with the center of the outer mark 1D of the shot area D. The center of the inner mark 4C of the shot area C is aligned with the center of the outer mark 2D of the shot area D. In this way, the exposure system is corrected according to measured error components, and: an exposure process is repeated thereafter, to zero the arrangement errors of the outer and inner marks and align the device patterns 6 with a rectangular or square lattice on the wafer.

Figure 9:
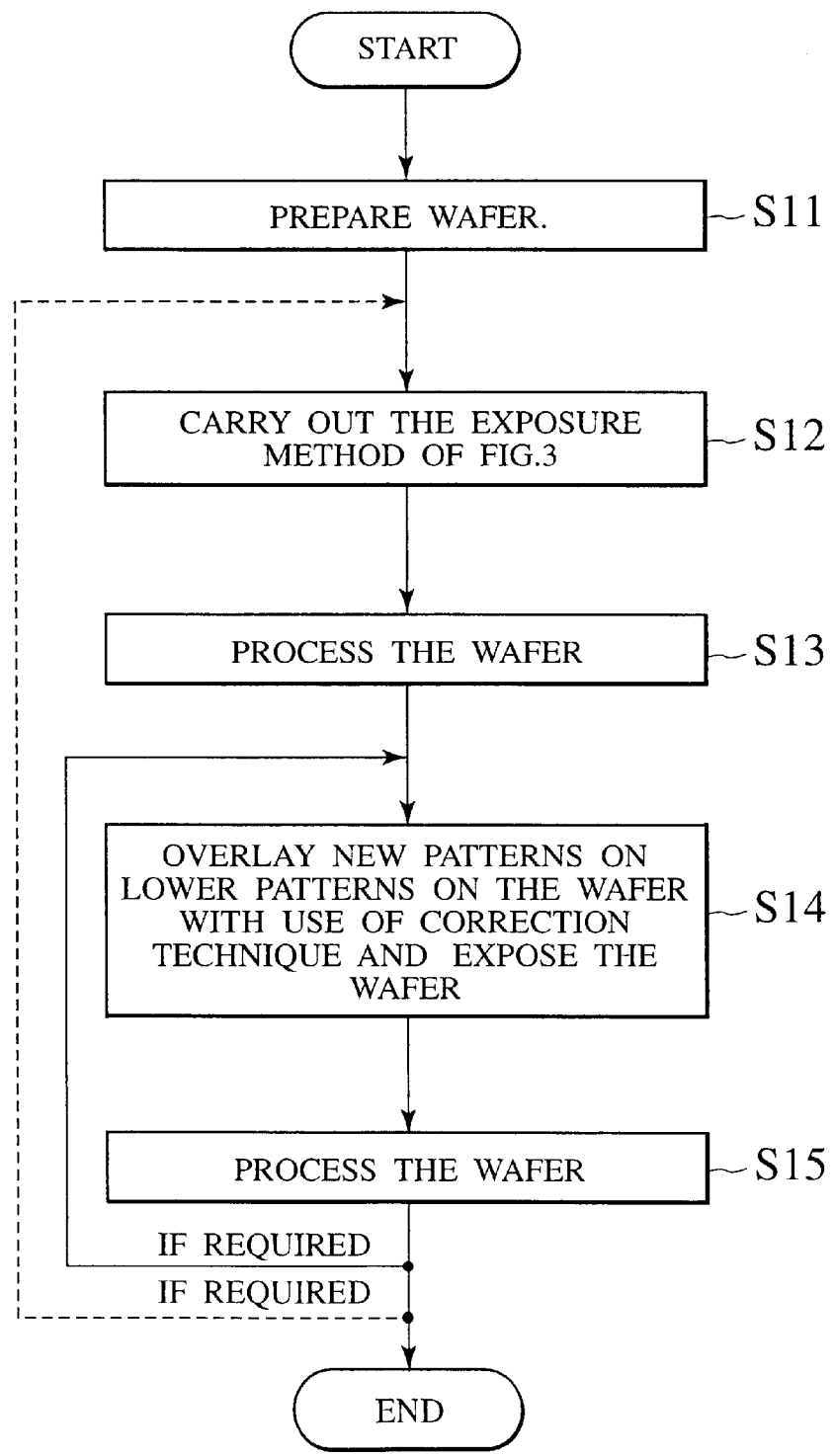
FIG. 9 is a flowchart showing a method of manufacturing semiconductor devices according to the first embodiment capable of reducing arrangement errors.

FIG. 9 is a flowchart showing a method of manufacturing semiconductor devices according to the first embodiment capable of reducing arrangement errors.

(a) Step S11 prepares a wafer.

(b) Step S12 carries out a first exposure process according to the flow of FIG. 3 with the exposure system 21. As shown in FIG. 1A, the exposure system 21 has a maximum shot area of 25 mm by 33 mm, and therefore, a reticle having three device (chip) patterns each of 22 mm by 11 mm in the shot area is prepared as shown in FIG. 4. As a result, step S12 forms device patterns 6 (FIG. 8) on a wafer with minimized arrangement errors.

(c) Step S13 carries out etching and impurity diffusing processes on the wafer.

Figure 1B:
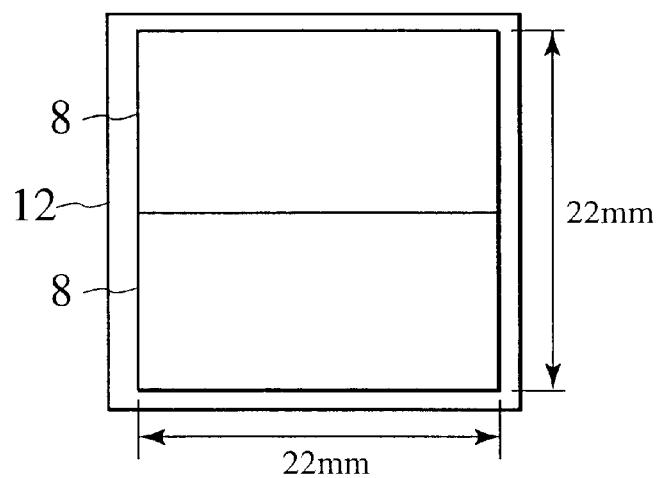
Figure 2:
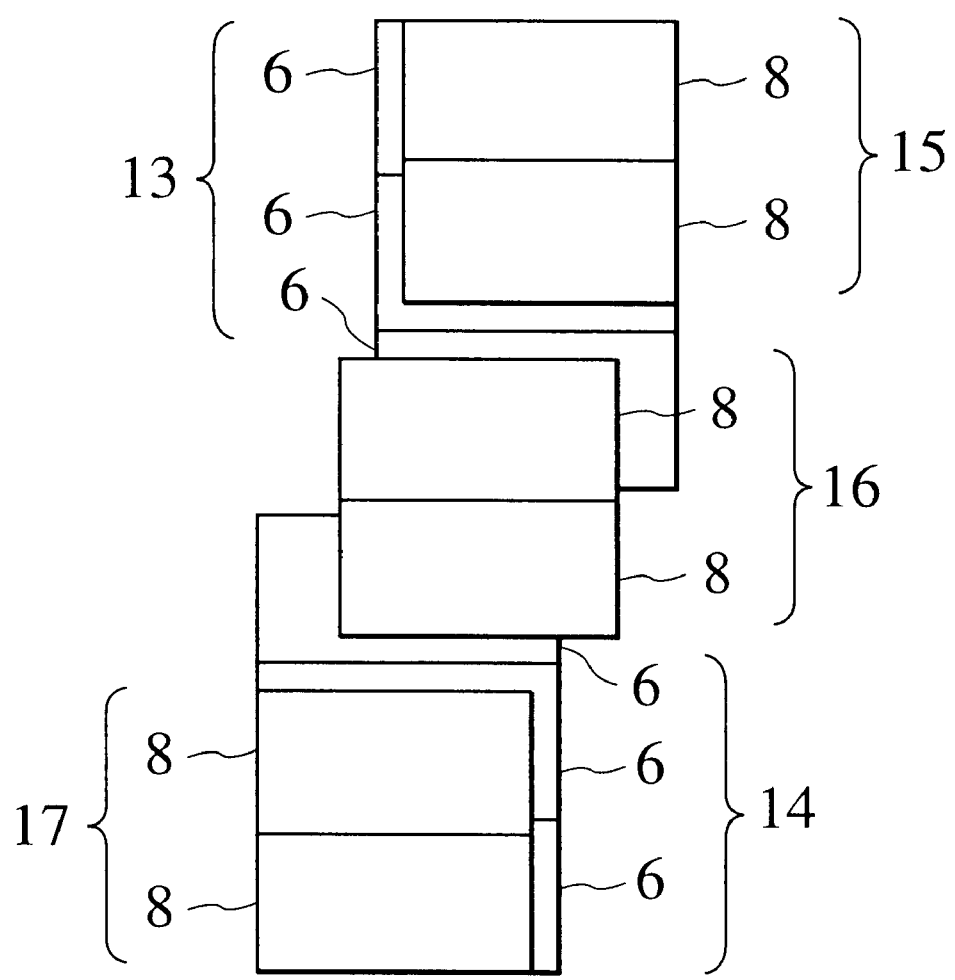
FIG. 2 shows device patterns formed on a wafer with the two exposure systems of FIGS. 1A and 1B.

(d) Step S14 carries out a second exposure process on the wafer. This process employs a technique of reducing superposition errors and forms new patterns on the patterns formed by the first exposure/development process. The second exposure process is carried out with the exposure system 22. As shown in FIG. 1B, the exposure system 22 has a maximum shot area of 22 mm by 22 mm, and therefore, a reticle having two device patterns each of 22 mm by 11 mm in the shot area is prepared.

Figure 10:
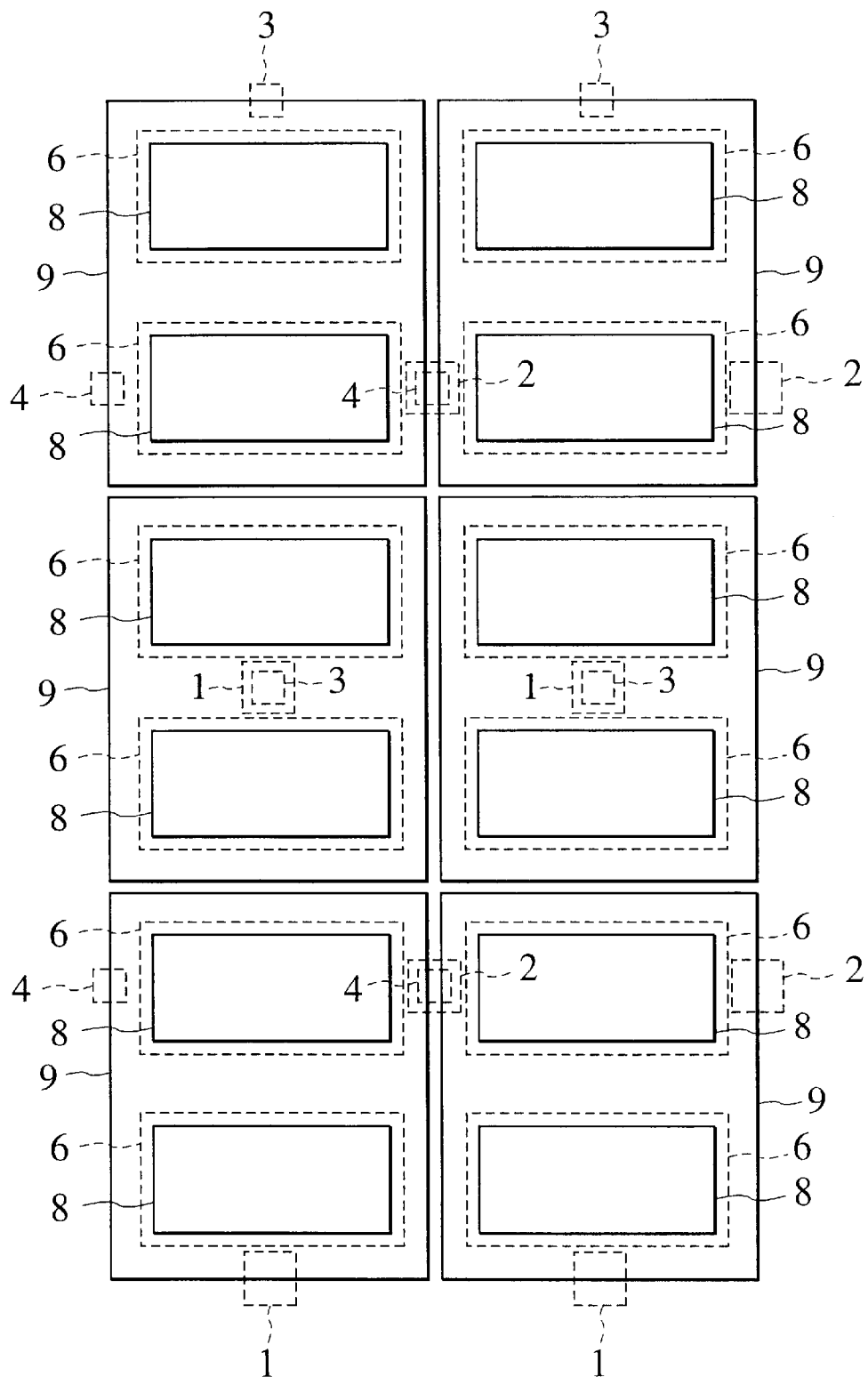
FIG. 10 shows the relationship between device patterns in a first exposure process by the exposure system 1 and device patterns in a second exposure process by the exposure system 22.

FIG. 10 shows the relationship between the device patterns formed by the first exposure process and the device patterns formed by the exposure system 22 in the second exposure process. The second exposure process superposes the device patterns 8 on the device patterns 6 formed by the first exposure process. To achieve this, the present invention puts alignment marks in each of the shot areas of the first and second exposure processes, and adjusts the position of each shot area of the second exposure process so that the alignment marks of the first and second exposure processes may agree with each other. To correctly superpose the device patterns of the second exposure process on the device patterns of the first exposure process, the present invention may employ the enhanced global alignment (EGA) technique that reads the alignment marks of the first exposure process and corrects errors in the read alignment marks when carrying out the second exposure process. The device patterns 6 formed by the first exposure process involve minimized arrangement errors, and therefore, the device patterns of the second exposure process are correctly superposed on the device patterns of the first exposure process in every shot area 9.

(e) Step S15 carries out etching and impurity diffusing processes on the wafer.

(f) If required, the flow returns to step S14 to carry out a third exposure process with other device patterns, and then step S15 processes the wafer. Thereafter, other manufacturing processes including exposure processes are carried out on the wafer, to complete semiconductor devices. If required, the flow may return to step S12.

In this way, the present invention correctly aligns shot areas with a rectangular or square lattice on a wafer in a first exposure process, so that shot areas of the second and later exposure processes may correctly be superposed on the shot areas of the first exposure process.

For an exposure system that sequentially transfers a shot area of a reticle onto a wafer, an exposing speed is mainly dependent on the number of shots to be made on the wafer. A time "Ttotal" needed for exposing a wafer is expressed as follows:

$$Ttotal = Tload + Txstep \times Nshot + Tystep \times Nrow \quad (5)$$

This expression assumes that the wafer is exposed in a row direction. In the expression, Txstep is a time for one lateral movement determined by the size of a chip, Nshot is the number of shots to be made on the wafer, Tystep is a time for one longitudinal movement determined by the size of the chip, and Nrow is the number of rows of shots to be made on the wafer. As the number of shots to be made on a wafer decreases, a time for processing the wafer greatly shortens.

The number of shots to be made on a wafer, i.e., the number of shots in a shot map is usually determined to produce a maximum number of chips. This, however, is not equal to an arrangement that brings a maximum processing speed for an exposure system. Once the size of a device or chip is determined, an arrangement of chips on a wafer that produces a maximum number of chips is determined. For this arrangement, there are Nshot and Nrow that minimize Ttotal.

The present invention aligns shots with a square or rectangular lattice on a wafer in a first exposure process. As a result, all exposure processes that follow the first exposure process may select shot arrangements that maximize the processing speed of each exposure system (optimum Nshot and Nrow that minimize Ttotal) when processing the wafer. This greatly improves the productivity of the exposure systems.

Second Embodiment

Figure 11A:
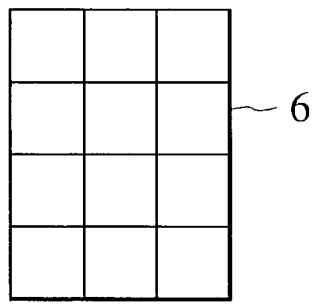
FIGS. 11A to 11D show the degree of freedom of arranging shot areas in a second exposure process according to a second embodiment of the present invention when the second exposure process superposes a second shot area over a first shot area of a first exposure process, the first and second shot areas containing different numbers of device patterns.
Figure 11B:
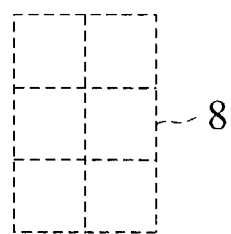

FIGS. 11A to 11D show the degree of freedom of arranging shot areas in a second exposure process according to a second embodiment of the present invention when the second exposure process superposes a second shot area over a first shot area of a first exposure process, the first and second shot areas containing different numbers of device patterns. In FIG. 11A, the shot area 6 has 12 device patterns and is used by a first exposure process. In FIG. 11B, the shot area 8 has six. device patterns and is used by a second exposure process.

Figure 11C:
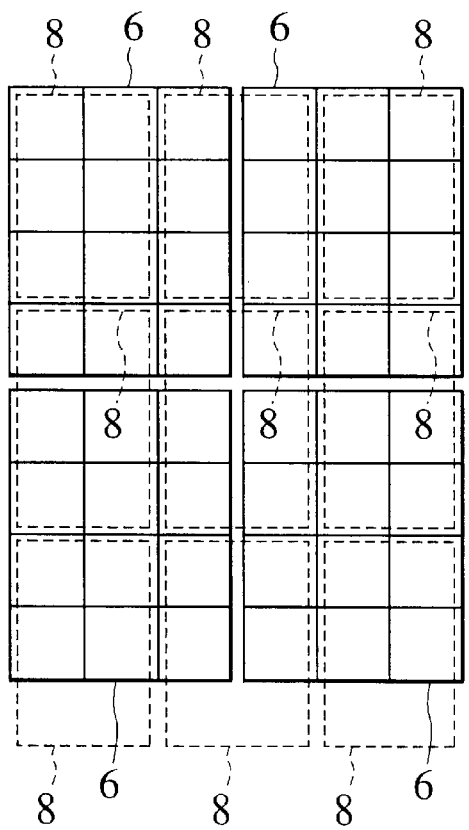
Figure 11D:
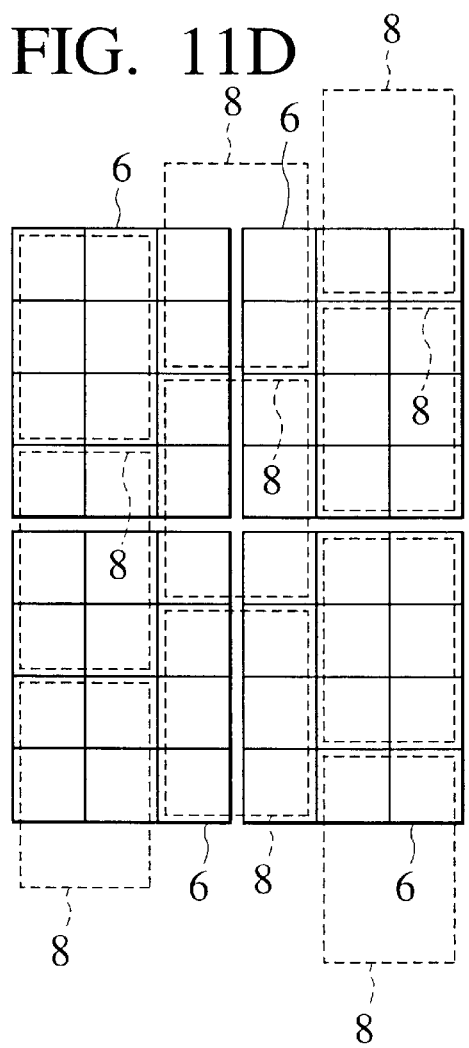

The first exposure process carries out the flow of FIG. 3 to reduce arrangement errors and forms, as shown in FIG. 11C, the device patterns of the shot area 6 along a square or rectangular lattice on a wafer. The second exposure process superposes, as shown in FIG. 11C, the device patterns of the shot area 8 over the device patterns of the shot area 6. Since the device patterns of the shot area 6 are aligned with a square or rectangular lattice on the wafer, the device patterns of the second exposure process are correctly superposed on the device patterns of the first exposure process. FIG. 11D shows a different arrangement of the device patterns of the shot area 8 formed by the second exposure process. Even if the shot area 8 is differently arranged over a wafer, the present invention correctly superposes the device patterns of the first and second exposure processes one upon another on the wafer. Consequently, the present invention allows optional arrangements of the shot area 8 in the second exposure process, to minimize the number of step-and-repeat operations.

Third Embodiment

Figure 12A:
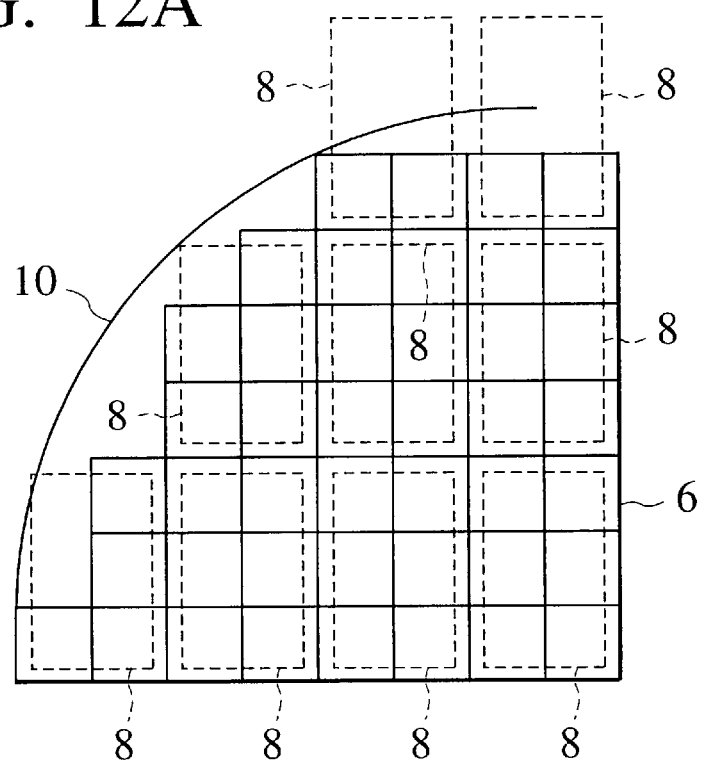
FIGS. 12A and 12B show the degree of freedom of arranging shot areas in a second exposure process according to a third embodiment of the present invention when a first exposure process is carried out on a circular wafer.
Figure 12B:
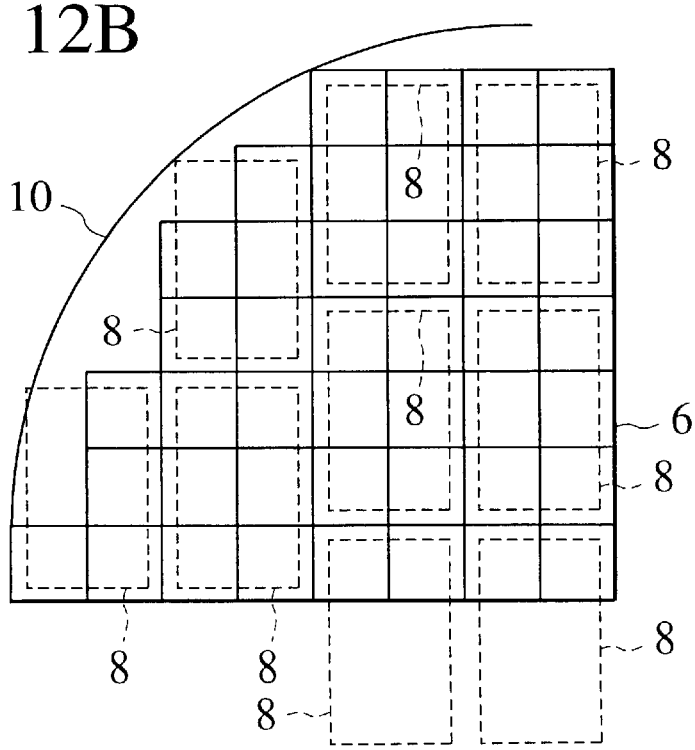

FIGS. 12A and 12B show the degree of freedom of arranging shot areas in a second exposure process according to a third embodiment of the present invention when a first exposure process is carried out on a circular wafer. The first exposure process is carried out according to the flow of FIG. 3. to reduce arrangement errors. The first exposure process forms, as shown in FIG. 12A, device patterns of a shot area 6 along a square or rectangular lattice on the circular wafer. When square device patterns are formed on a circular wafer, only some device patterns of each shot area are effective at the periphery of the wafer. Since the device patterns of the first exposure process are correctly aligned with a square or rectangular lattice on the wafer, device patterns of the second and later exposure processes may be formed on the wafer according to optional shot layouts. The second exposure process superposes device patterns of a shot area 8 on the device patterns of the shot area 6 as shown in FIG. 12A. Since the device patterns of the shot area 6 are aligned with a square or rectangular lattice, the device patterns of the second exposure process may correctly be superposed on the device patterns of the first exposure process. FIG. 12B shows a different layout of device patterns of the shot area 8 in the second exposure process. Even with different layouts of device patterns, the first and second exposure processes are able to correctly align the device patterns with one another. In this way, the present invention enables the second exposure process to employ optional layouts of device patterns of the shot area 8. The present invention can select a layout that minimizes the number of step-and-repeat operations. Even if the sizes of shot areas of the first and second exposure processes differ from each other, the present invention is capable of choosing a shot arrangement (shot map) that maximizes throughputs and improves an exposure speed.

Fourth Embodiment

It must be understood that the descriptions and drawings related to the above-mentioned embodiments are not intended to limit. the present invention. Many alternatives, modifications, and applications will be achievable based on the disclosure of the present invention.

Figure 13:
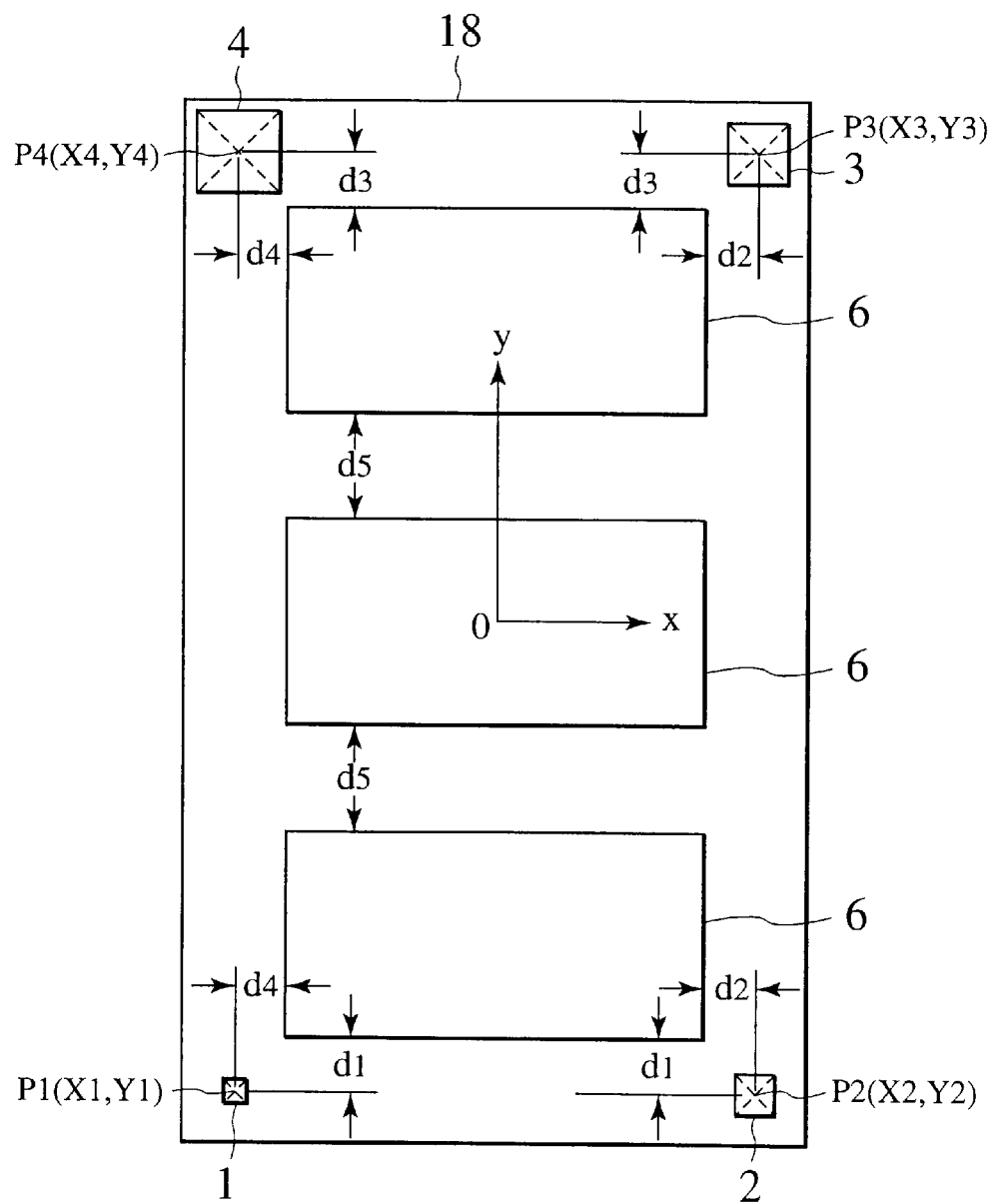
FIG. 13 is a plan view showing a shot area on a reticle according to a fourth embodiment of the present invention.
Figure 14:
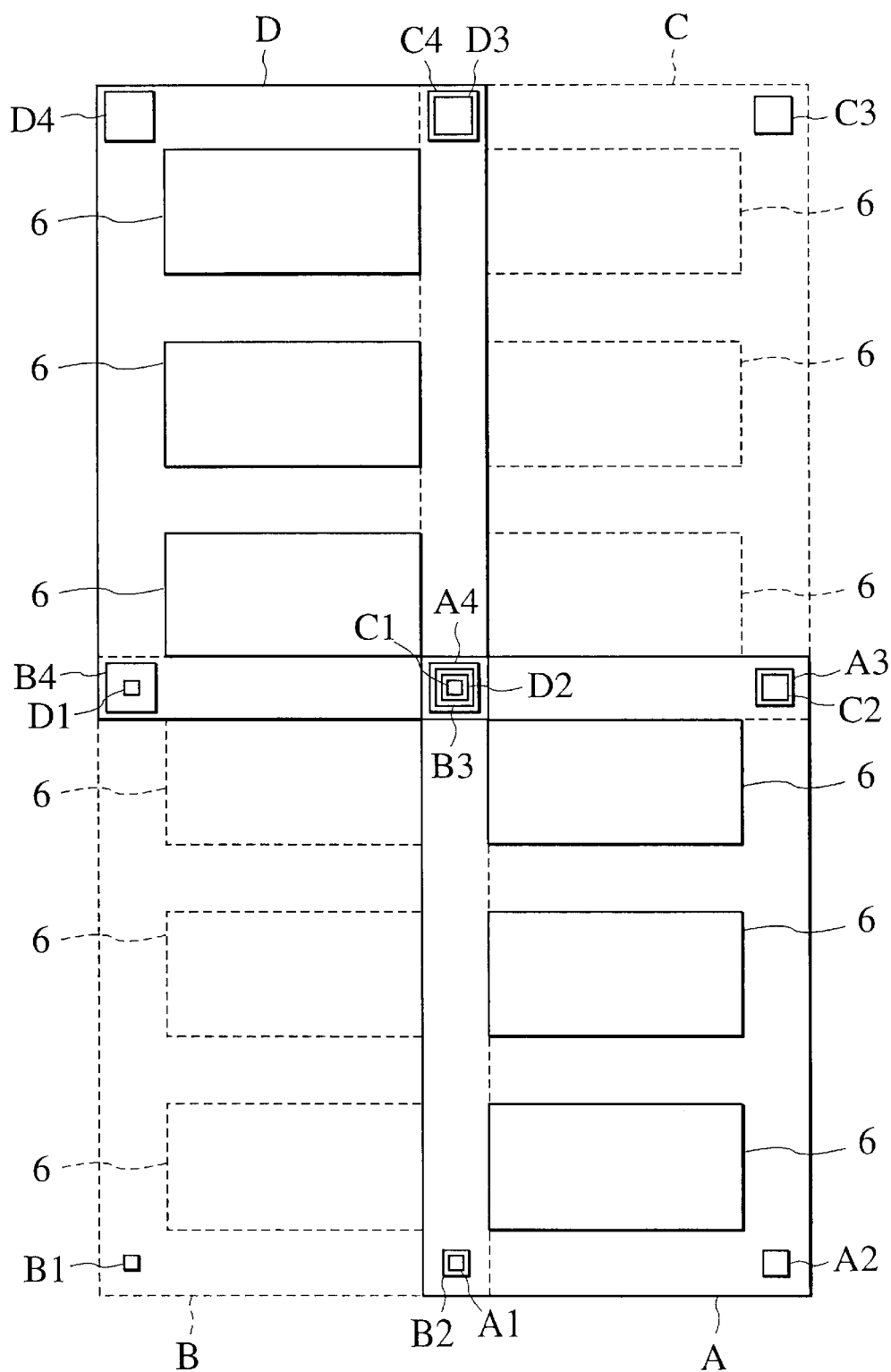
FIG. 14 shows positions on a wafer where the shot area of FIG. 13 is positioned by step-and-repeat operations during an exposure process.

Although the first embodiment puts two pairs of outer and inner marks on a reticle to measure arrangement errors, other arrangements of the marks are also possible. For example, FIG. 13 shows a shot area 18 on a reticle having four marks 1 to 4 of different sizes at the four corners, respectively. FIG. 14 shows positions on a wafer where the shot area 18 is transferred by step-and-repeat operations. Each of four shot areas A, B, C, and D on the wafer corresponds to the shot area 18 of FIG. 13. The center of a mark A1 of the shot area A is designed to agree with the center of a mark B2 of the shot area B. The center of a mark A3 of the shot area A is designed to agree with the center of a mark C2 of the shot area C. The center of a mark B4 of the shot area B is designed to agree with the center of a mark D1 of the shot area D. The center of a mark C4 of the shot area C is designed to agree with the center of a mark D3 of the shot area D. The center of a mark A4 of the shot area A, the center of a mark B3 of the shot area B, the center of a mark C1 of the shot area C, and the center of a mark D2 of the shot area D are designed to agree with one another. Arrangement errors among the shot areas A to D are measurable like FIG. 6. The number of arrangement errors to be measured in FIG. 14 is 10 that is more than twice that of FIG. 6 in which the number of arrangement errors to be measured is four. Accordingly, the technique of FIG. 14 is capable of more correctly arranging shot areas on a wafer.

The embodiments mentioned above form a plurality of device patterns in a shot area. Instead, a plurality of shot areas may form a single device pattern. Namely, the present invention is applicable to manufacture a semiconductor device that extends over a plurality of shot areas.

In this way, the present invention includes many other forms of implementation. Accordingly, the technical scope of the present invention is only defined by claims that are properly based on the above descriptions.

In summary, the present invention provides. an exposure method capable of reducing arrangement errors and effectively using a shot area of an exposure system even for a process that imposes a small allowance for superposition errors. The present invention enables one to select a shot layout that may minimize the operating time of an exposure system, thereby improving the using efficiency and productivity of the exposure system.

The present invention also provides a reticle applicable to the exposure method that is capable of reducing arrangement errors and effectively using a shot area of an exposure system even for a process that imposes a small allowance for superposition errors.

The present invention also provides a method of manufacturing semiconductor devices capable of reducing arrangement errors and effectively using a shot area of an exposure system even for a process that imposes a small allowance for superposition errors.

Various modifications will become possible for those skilled in the art after receiving the teachings of the present disclosure without departing from the scope thereof.

What is claimed is:

1. An exposure method comprising:

forming, in a shot area of rectangular or square shape on a reticle, device patterns being congruent with one another and being correctly superposed one upon another by making only a parallel translation of the device patterns with perpendicular on a first side of the shot area, a first mark having a first aligning point and formed outside the device patterns in the vicinity of the first side of said shot area, and a second mark having a second aligning point and formed outside the device patterns in the vicinity of a second side of the shot area opposite to the first side, identified by a first straight line connecting the first aligning point and a second aligning point being perpendicular to the first side, being distinguishable from said first mark and identified by a distance between the first aligning point and the second aligning point being an integer multiple of a distance of the parallel translation;

transferring the first mark and the second mark from the reticle onto a wafer through exposure and development processes using an exposure system;

measuring arrangement errors according to the first mark and the second mark on the wafer;

calculating four error components from the measured arrangement errors; and correcting the exposure system according to the calculated error components.

2. The method of claim 1, wherein the first mark and the second mark are formed at least in the vicinities of four sides of the shot area of the reticle, respectively.

3. The method of claim 1, wherein the first and the second mark are box-in-box marks or bars-in-bars marks serving as outer and inner marks.

4. A reticle comprising:

a shot area of rectangular or square shape;

a device pattern formed in said shot area;

a first mark having a first aligning point and formed inside said shot area and outside said device pattern in the vicinity of a first side of said shot area and a second side of said shot area in contact with the first side;

a second mark having a second aligning point and formed inside said shot area and outside said device pattern in the vicinity of a third side of said shot area opposite to the first side, identified by a first straight line connecting the first and second aligning points being perpendicular to the first side, being distinguishable from said first mark;

a third mark having a third aligning point and formed inside said shot area and outside said device pattern in the vicinity of the first side and a fourth side opposite to the second side, identified by a second straight line connecting the first and third aligning points being perpendicular to the second side, being distinguishable from said first and second marks; and a fourth mark having a fourth aligning point and formed inside said shot area and outside the device pattern in the vicinity of the third side and a fourth side, identified by a third straight line connecting the second and fourth aligning points being perpendicular to the second side, a fourth straight line connecting the third and fourth aligning points being perpendicular to the first side, being distinguishable from said first, second and third marks.

5. The reticle of claim 4, wherein the shot area contains a plurality of device patterns, the device patterns being congruent with one another and being correctly superposed one upon another only when the device patterns are translated in parallel with the sides of the shot area.

6. The reticle of claim 5, wherein a distance between the second and third straight lines is an integer multiple of a distance of the translation in parallel with the sides.

7. The reticle of claim 5, wherein a distance between the first and fourth straight line is an integer multiple of a distance of the translation in parallel with the sides.

8. The reticle of claim 5, wherein:

distance of the translation is fixed in each translation direction.

9. The reticle of claim 4, wherein the third and fourth marks are box-in-box marks or bars-in-bars marks serving as outer and inner marks.

10. A reticle comprising:

a shot area of rectangular or square shape;

first device patterns formed in the shot area, being congruent with one another and being correctly superposed one upon another by making only a parallel translation of said first device patterns with a perpendicular on a first side of said shot area;

a first mark having a first aligning point and formed inside said shot area and outside said first device patterns in the vicinity of the first side of said shot area; and a second mark having a second aligning point and formed inside said shot area and outside said first device patterns in the vicinity of a second side of said shot area opposite to the first side, identified by a first straight line connecting the first aligning point and a second aligning point being perpendicular to the first side, being distinguishable from said first mark and identified by a distance between the first aligning point and the second aligning point being an integer multiple of a distance of the parallel translation.

11. The reticle of claim 10, further comprising:

a third mark having a third aligning point and formed inside said shot area and outside said first device pattern in the vicinity of a third side of the shot area; and a fourth mark having a fourth aligning point and formed inside said shot area and outside said first device pattern in the vicinity of a fourth side and said shot area opposite to the third side, a straight that connects the third and fourth aligning points being perpendicular to the third side, the third and fourth marks being distinguishable from each other.

12. The reticle of claim 11, wherein a distance of the parallel translation is fixed in each translation direction.

13. The reticle of claim 11, wherein said third and fourth marks are box-in-box marks or bars-in-bars marks serving as outer and inner marks.

14. The method of claim 11, wherein second device patterns formed in said shot area, being congruent with said first device patterns and being correctly superposed one upon another by making only a parallel translation of said second device patterns with the first side of said shot area, and identified by a distance between the third aligning point and the fourth aligning point being an integer multiple of a distance of the parallel translation of said second device patterns.

15. The reticle of claim 10, wherein a distance of the parallel translation is fixed in each translation direction.

16. The reticle of claim 10, wherein said first and second marks are box-in-box marks or bars-in-bars marks serving as outer and inner marks.

17. A method a manufacturing a semiconductor device, comprising:

forming, in a shot area of rectangular or square shape on a reticle, device patterns being congruent with one another and being correctly superposed one upon another by making only a parallel translation of the device patterns with a perpendicular on a first side of the shot area, a first mark having a first aligning point and formed outside the device patterns in the vicinity of the first side of said shot area, and a second mark having a second aligning point and formed outside the device patterns in the vicinity of a second side of the shot area opposite to the first side identified by a first straight line connecting the first aligning point and a second aligning point being perpendicular to the first side, being distinguishable from said first mark and identified by a distance between the first aligning point and the second aligning point being an integer multiple of a distance of the parallel translation;

transferring the first mark and second mark from the reticle onto a wafer through exposure and development processes using an exposure system;

measuring arrangement errors according to the first mark and second mark on the wafer;

calculating four error components from the measured arrangement errors;

correcting the exposure system according to the calculated error components; and superposing device patterns on the developed device patterns on the wafer through an exposure process using the exposure system.

18. The method of claim 17, wherein the size of a shot area used by said superposing differs from the size of the shot area used by said forming.

19. The method of claim 17 wherein said transferring is an exposure process carried out on the wafer for the first time.

20. A reticle comprising:

a shot area of rectangular or square shape;

device patterns formed in the shot area, being congruent with one another and being correctly superposed one upon another by making only a parallel translation of said device patterns with perpendicular on a first side of said shot area, separated equally from one another by a first distance;

a first mark having a first aligning point and formed inside said shot area and outside said device patterns in the vicinity of a first side of said shot area, separated from said device pattern by a second distance; and a second mark having a second aligning point and formed inside said shot area and outside said device patterns in the vicinity of a second side of said shot area opposite to the first side, identified by a first straight line connecting the first and second aligning points being perpendicular to the first side, being distinguishable from said first mark, separated from said device patterns by a third distance, wherein the first distance is equal to the sum of the second distance and the third distance.

* * * * *

UNITED STATES PATENT AND TRADEMARK OFFICE
CERTIFICATE OF CORRECTION

PATENT NO.   : 6,558,852 B1
DATED        : May 6, 2003
INVENTOR(S)  : Tawarayama et al.

It is certified that error appears in the above-identified patent and that said Letters Patent is hereby corrected as shown below:

Column 13,
Line 2, change "line" to -- lines --.
Line 5, before "distance" insert -- a --.
Line 39, change "straight that" to -- straight line that --.

Column 14,
Line 1, change "method a" to -- method of --.

Signed and Sealed this

Seventh Day of October, 2003

JAMES E. ROGAN
*Director of the United States Patent and Trademark Office*